(12) United States Patent
Percival et al.

(10) Patent No.: US 11,099,063 B2
(45) Date of Patent: Aug. 24, 2021

(54) APPARATUS AND METHOD FOR PROFILING A BEAM OF A LIGHT EMITTING SEMICONDUCTOR DEVICE

(71) Applicant: Facebook Technologies, LLC, Menlo Park, CA (US)

(72) Inventors: Christopher Percival, Cork (IE); Vincent Brennan, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 140 days.

(21) Appl. No.: 15/103,344

(22) PCT Filed: Dec. 10, 2014

(86) PCT No.: PCT/EP2014/077277
§ 371 (c)(1),
(2) Date: Jun. 10, 2016

(87) PCT Pub. No.: WO2015/086704
PCT Pub. Date: Jun. 18, 2015

(65) Prior Publication Data
US 2016/0313180 A1 Oct. 27, 2016

(30) Foreign Application Priority Data
Dec. 11, 2013 (GB) ..................................... 1321929

(51) Int. Cl.
*G01J 1/42* (2006.01)
*G01R 31/26* (2020.01)
(Continued)

(52) U.S. Cl.
CPC ........... *G01J 1/4257* (2013.01); *G01J 1/0266* (2013.01); *G01J 1/0407* (2013.01); *G01J 1/0411* (2013.01);
(Continued)

(58) Field of Classification Search
CPC .. G01R 31/2635; G01J 1/0266; G01J 1/0474; G01J 1/0407; G01J 1/0411; G01J 1/4257; G01J 2001/4252; G01J 2001/4261
(Continued)

(56) References Cited

U.S. PATENT DOCUMENTS 6,384,612 B2 * 5/2002 Freund ...................... G01J 1/04
 324/754.23
7,056,000 B2 * 6/2006 Hussey .............. G01R 31/2635
 250/208.1

(Continued)

FOREIGN PATENT DOCUMENTS

JP S64 38617 2/1989
JP 2000 232242 8/2000
(Continued)

OTHER PUBLICATIONS

International Search Report and Written Opinion for related International Application No. PCT/EP2014/077277 dated Apr. 4, 2015.

*Primary Examiner* — Isiaka O Akanbi
(74) *Attorney, Agent, or Firm* — Fenwick & West LLP (57) ABSTRACT

Methods and apparatus (100) for profiling a beam of a light emitting semiconductor device. The apparatus comprises a light emitting semiconductor device (102) comprising an active region (108) formed on a substrate (104) and configured to generate light when a suitable electrical current is applied to contacts on an upper surface of the device and a light emitting surface (110) defined by a lower surface of the substrate opposite the contacts. The apparatus further comprises a transmission medium (112) comprising a first surface (114) in contact with at least part of the light emitting surface of the semiconductor device and a diffusion surface (116), opposite the first surface, and configured to diffuse light emitted from the micro-LED and transmitted through the transmission medium.

20 Claims, 3 Drawing Sheets

(51) Int. Cl.
 *G01J 1/02* (2006.01)
 *G01J 1/04* (2006.01)

(52) U.S. Cl.
 CPC ........ *G01J 1/0474* (2013.01); *G01R 31/2635* (2013.01); *G01J 2001/4252* (2013.01); *G01J 2001/4261* (2013.01)

(58) Field of Classification Search
 USPC .................. 356/121, 237.2–237.6, 213–236
 See application file for complete search history.

(56) References Cited

U.S. PATENT DOCUMENTS

| | | | | |
|---|---|---|---|---|
| 7,626,403 | B2 * | 12/2009 | Ou | G01J 1/02 324/750.3 |
| 8,767,198 | B2 * | 7/2014 | Tsai | G01J 1/04 356/213 |
| 9,546,926 | B2 * | 1/2017 | Ji | G01J 1/42 |
| 2005/0253046 | A1 | 11/2005 | Bulpitt | |
| 2009/0309606 | A1 * | 12/2009 | Tseng | G01J 1/02 324/501 |
| 2012/0249776 | A1 * | 10/2012 | Ji | G01R 31/2635 348/125 |
| 2012/0250021 | A1 * | 10/2012 | Cheng | G01J 3/51 356/417 |
| 2013/0015859 | A1 | 1/2013 | Tseng | |
| 2013/0321794 | A1 | 12/2013 | Cheng | |

FOREIGN PATENT DOCUMENTS

| | | |
|---|---|---|
| JP | 2002 005785 | 1/2002 |
| WO | WO2012/077190 | 6/2012 |

* cited by examiner

APPARATUS AND METHOD FOR PROFILING A BEAM OF A LIGHT EMITTING SEMICONDUCTOR DEVICE

TECHNICAL FIELD

The invention relates to methods and apparatus for profiling a beam of a light emitting semiconductor device. More specifically, the invention relates to, but is not limited to, methods and apparatus for profiling a beam of a micro-LED on wafer.

BACKGROUND

Micro-LEDs are often considered to produce quasi-collimated light, in that the light emitted from a micro-LED is typically more collimated than light emitted from a standard LED and not as collimated as light emitted from a laser. A measure of the quality of a micro-LED is the half angle of the quasi-collimated light it produces.

As such, it is desirable to be able to profile the beam emitted from a micro-LED to determine the intensity of the beam at a plurality of angles to a normal.

There exist a number of methods and apparatus for of characterising an output of a light emitting device. For example, existing laser beam profilers use camera and lens systems to form a real image of a beam emitted from a laser directly onto a detector of the camera. For divergent beams, this requires the detector or lens to be very large and placed very close to the laser device.

In other systems, a beam emitted from an LED device may be characterised using a goniometer, although devices must be diced and packaged before these may be used accurately.

Arrangements involving diffusion screens are also known and use a reflective geometry to reflect light emitted by a device from a diffusive screen to measure a radiation profile of the device Additionally, an integrating sphere may be used to characterise the power of a beam from a light emitting device. An integrating sphere is an optical component having an internal spherical cavity that is coated with a diffuse white reflective coating. Light from a device enters the integrating sphere and is summed to give an indication of the power of the beam.

Known methods and apparatus for characterising a beam emitted from an LED device do not allow all of a beam (i.e., from −90 degrees to +90 degrees to the normal) to be characterised and do not allow characterisation at the wafer level, that is, while the devices are still on a wafer.

SUMMARY

It is an object of the invention to mitigate or alleviate one or more problems with known methods of characterising a beam emitted from an light emitting semiconductor device (such as a micro-LED device), including those problems discussed above.

According to the invention in a first aspect, there is provided an apparatus for profiling a beam of a light emitting semiconductor device, comprising: a light emitting semiconductor device comprising an active region formed on a substrate and configured to generate light when a suitable electrical current is applied to contacts on an upper surface of the device, and a light emitting surface defined by a lower surface of the substrate opposite the contacts; and a transmission medium comprising a first surface in contact with at least part of the light emitting surface of the semiconductor device and a diffusion surface, opposite the first surface, and configured to diffuse light emitted from the semiconductor device and transmitted through the transmission medium.

Optionally, the transmission medium has a thickness of 3 mm or greater.

Optionally, the transmission medium has a refractive index substantially equal to a refractive index of the substrate of the light emitting semiconductor device, such that there is substantially no reflection at the interface between the transmission medium and the substrate of the light emitting semiconductor device.

Optionally, the transmission medium comprises one of: glass; and sapphire.

Optionally, the diffusion surface of the transmission medium has been treated to produce a diffusion surface integral to the transmission medium.

Optionally, the diffusion surface comprises a diffusion coating applied to the transmission medium.

Optionally, the diffusion coating comprises an anti-reflective coating configured to reduce the amount of light reflected by the diffusion surface back into the transmission medium.

Optionally, wherein the diffusion surface of the transmission medium is configured to diffuse light in a substantially Lambertian diffusion profile.

Optionally, the apparatus further comprises a pair of probes configured to apply an electrical current to the contacts of the light emitting semiconductor device for causing the active layer to generate light.

Optionally, the apparatus further comprises a camera configured to capture an image of light at the diffusion surface that has been emitted from the light emitting semiconductor device.

Optionally, the camera comprises a lens with a magnification factor of less than 1.

Optionally, the transmission medium has a refractive index and a thickness configured to present at the diffusion surface the light emitted from the light emitting semiconductor device, wherein the image falls within a field of view of the camera.

Optionally, the thickness of the transmission medium is greater than a depth of field of the lens of the camera.

Optionally, the apparatus further comprises a controller, the controller comprising a beam profiler configured to process an image, captured by the camera, of light at the diffusion surface to determine an angle to a normal of light that would be emitted into air from the light emitting surface of the light emitting semiconductor device.

Optionally, the beam profiler is configured to determine a plurality of angles in a range from −90 degrees to +90 degrees with respect to a normal of light that would be emitted into air from the light emitting surface of the light emitting semiconductor device.

Optionally, at least one of the plurality of angles is in a range from ±90 degrees and ±80 degrees to the normal.

Optionally, the apparatus further comprises a power meter configured to determine a power of the light at the diffusion surface and to transmit data indicative of the determined power to the beam profiler.

Optionally, the power meter is offset from the camera, the apparatus further comprising a beam splitter configured to direct a portion of the beam emitted from the semiconductor device to the power meter.

Optionally, the beam profiler is configured to determine a power of the light at the diffusion surface based on an intensity of a pixel of the image.

Optionally, the beam profiler is configured to determine an angle into air at which the light forming the pixel would be transmitted by the light emitting semiconductor device using:

$$\sin^{-1}\left[\frac{n_1}{n_2}\sin\left(\tan^{-1}\left(\frac{w}{h}\right)\right)\right]$$

wherein, $n_1$ is a refractive index of the substrate, $n_2$ is a refractive index of the transmission medium, w is a distance of the pixel from a centre of the light at the diffusion surface and h is the thickness of the transmission medium.

Optionally, the controller comprises a profiling manager configured to coordinate the operation of the pair of probes and the camera, such that the camera captures an image during a time when the probes are applying an electrical current to the light emitting semiconductor device.

Optionally, the light emitting semiconductor device comprises one of: an LED; a micro-LED; and a laser.

Optionally, the apparatus comprises a plurality of light emitting semiconductor devices grown on a silicon wafer, wherein the first surface of the transmission medium is in contact with the light emitting surfaces of more than one of the plurality of light emitting semiconductor devices.

Optionally, the first surface of the transmission medium is in contact with the light emitting surfaces of all of the plurality of light emitting semiconductor devices.

According to the invention in a second aspect, there is provided a method for profiling a beam of a light emitting semiconductor device, the method comprising: applying an electrical current to contacts on an upper surface of a light emitting semiconductor device, the light emitting semiconductor device comprising an active region formed on a substrate and a light emitting surface defined by a lower surface of the substrate opposite the contacts; transmitting light emitted from the light emitting semiconductor device through a transmission medium comprising a first surface in contact with at least part of the light emitting surface of the light emitting semiconductor device and a diffusion surface, opposite the first surface, and configured to diffuse light emitted from the light emitting semiconductor device and transmitted through the transmission medium; and determining intensity power of light that would be emitted into air from the light emitting semiconductor device at one or more angles with respect to a normal.

According to the invention in a third aspect, there is provided a method for profiling a beam of a light emitting semiconductor device, the method comprising: processing, by a beam profiler, an image to determine intensity power of light that would be emitted into air from the light emitting semiconductor device at one or more angles with respect to a normal, the image comprising light emitted from a light emitting semiconductor device comprising an active region formed on a substrate and configured to generate light when a suitable electrical current is applied to contacts on an upper surface of the device, and a light emitting surface defined by a surface of the substrate opposite the contacts, the light further being transmitted through a transmission medium comprising a first surface in contact with at least part of the light emitting surface of the light emitting semiconductor device and a diffusion surface, opposite the first surface, and configured to diffuse light emitted from the light emitting semiconductor device and transmitted through the transmission medium.

Optionally, the beam profiler is configured to determine an angle into air at which light forming a pixel of the image would be transmitted by the light emitting semiconductor device using:

$$\sin^{-1}\left[\frac{n_1}{n_2}\sin\left(\tan^{-1}\left(\frac{w}{h}\right)\right)\right]$$

wherein, $n_1$ is a refractive index of the substrate, $n_2$ is a refractive index of the transmission medium, w is a distance of the pixel from a centre of the light at the diffusion surface and h is the thickness of the transmission medium.

According to the invention in a fourth aspect, there is provided a non-transitory computer readable medium comprising computer readable code configured, when read by a computer, to carry out the method described above.

According to the invention in a fifth aspect, there is provided a computer program comprising computer readable code configured, when read by a computer, to carry out the method described above.

According to the invention in a sixth aspect, there is provided an apparatus for profiling a beam of a light emitting semiconductor device, comprising: a light emitting semiconductor device comprising an active region formed on a substrate and configured to generate light when a suitable electrical current is applied to contacts on an upper surface of the device, and a light emitting surface defined by a surface of the substrate opposite the contacts; and a transmission medium comprising a first surface in contact with at least part of the light emitting surface of the light emitting semiconductor device, wherein the transmission medium has a thickness of 3 mm or greater.

According to the invention in a seventh aspect, there is provided an apparatus for profiling a beam of a light emitting semiconductor device, comprising: a light emitting semiconductor device comprising an active region formed on a substrate and configured to generate light when a suitable electrical current is applied to contacts on an upper surface of the device, and a light emitting surface defined by a surface of the substrate opposite the active region; and a transmission medium comprising a first surface in contact with at least part of the light emitting surface of the light emitting semiconductor device, wherein the transmission medium has a refractive index substantially the same as a refractive index of the substrate.

According to the invention in a eighth aspect, there is provided an apparatus for profiling a beam of a light emitting semiconductor device substantially as herein described with reference to the accompanying drawings.

BRIEF DESCRIPTION OF DRAWINGS

Exemplary embodiments of the invention are disclosed herein with reference to the accompanying drawings, in which.

DESCRIPTION

Generally, disclosed herein are methods and apparatus for profiling a beam emitted from a micro-LED device. The methods and apparatus may be applied while the device (and possibly a number of other devices) is still on wafer. Further, the methods and apparatus allow the measurement of divergent beams all the way out to ±90 degrees to the normal.

As set out in detail below, the methods and apparatus disclosed use a transmissive geometry and emit light through a transmission medium with a refractive index greater than air to allow measurement of divergent beams out to ±90 degrees and permit testing at a wafer level.

The use of the methods and apparatus disclosed herein allow significant advantages over known methods and apparatus for characterisation of beams emitted from light emitting devices, including:

sample engineering testing during process/device characterisation and development high volume production testing to verify wafer uniformity, wafer to wafer and batch to batch controls high volume production testing to classify and/or bin devices according to performance high volume production testing to qualify the assurance of delivered devices are within agreed datasheet specifications for upper and lower limits sample characterisation testing for key datasheet parameters sample application specific characterisation testing Disclosed herein are methods and apparatus for wafer-level, camera-based beam profile measurement of a micro-LED device. The methods and apparatus may include a power meter placed at 90 degrees to a camera. A beam splitter with a well defined split ratio (i.e. 9:1) may be used such that so 90% of the light is passed to the power meter to give an accurate measure of the power of the beam. The remaining 10% of the beam would be passed to the camera and is adequate for an accurate beam measurement as the charge coupled devices (CCDs) of the camera are very sensitive.

This document focusses on the evaluation of a device beam profile using a camera based apparatus. Results are from a sequence of calibration tests conducted in June/July 2013 to evaluate the accuracy and repeatability of the system. A zeiss ER5c camera and x0.33 zero distortion lens may be used with an opal-on-6 mm-glass transmission medium.

Figure 1:
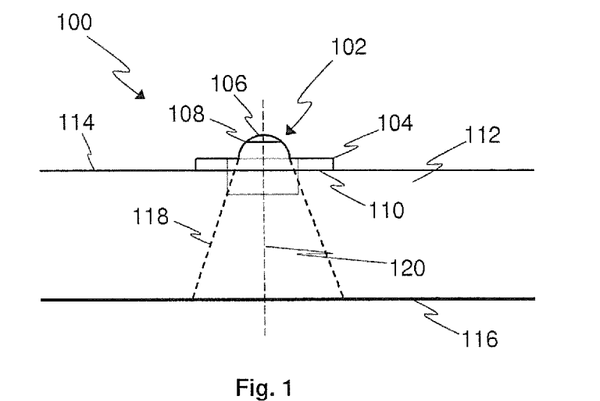
FIG. 1 is a schematic representation of an apparatus for profiling a beam of a light emitting semiconductor device.

FIG. 1 shows a schematic representation of an apparatus 100 for profiling a beam of a micro-LED device 102. The apparatus comprises a micro-LED 102 comprising a substrate 104 and an epitaxial layer 106 grown on the substrate 104. At least part of the substrate 104 and the epitaxial layer 106 are formed into a mesa. The mesa includes an active region 108 configured to emit light on application of an electrical current across the micro-LED device. The micro-LED device has a light emitting surface 110, which is the lower surface of the substrate 104 opposite the active region 108. The micro-LED is therefore a "bottom emitting" device.

For the avoidance of doubt, relative terms, such as upper, lower, left and right are used herein for descriptive purposes and need not impose any limitation on the features of the methods and apparatus disclosed.

The apparatus 100 further comprises a transmission medium 112, which, in exemplary apparatus may be manufactured using glass or sapphire or any material sufficiently transparent not to cause any chromatic dispersion. The transmission medium may be a bulk transmission medium. The transmission medium 112 has a first, upper, surface 114 that is in optical communication with the light emitting surface 110 of the micro-LED 102. In exemplary apparatus 100, the upper surface 114 of the transmission medium 112 is in contact with the light emitting surface 110 of the micro-LED to form an interface.

It is noted that, for clarity, FIG. 1 is not drawn to scale and the micro-LED 102 would, in practical apparatus 100, be significantly smaller than shown, such that it would be seen virtually as a point source. Typical sizes of the mesa are in the region of 20 micrometres. A typical thickness of the transmission medium may be 6 millimetres. More generally, exemplary apparatus 100 may comprise a transmission medium having a thickness of 5 millimetres or greater.

The transmission medium 112 may further comprise a diffusion surface 116 on a bottom surface of the transmission medium 112 opposite the active region 108. The diffusion surface 116 is configured to diffuse light 118 emitted from the light emitting surface 110 of the micro-LED 102 and transmitted through the transmission medium. As such, the diffusion surface is configured to display a diffused image of the light 118 emitted by the micro-LED 102.

The diffusion surface 116 may be formed by treating the bottom surface of the transmission medium 112. For example, the diffusion layer 116 may be formed by a process that roughens the bottom surface of the transmission medium 112. In such exemplary apparatus 100, the diffusion surface is integral to the transmission medium 112. In alternative apparatus 100, the diffusion surface 116 may be form by the application of a diffusion coating that may be applied to the bottom surface of the transmission medium 112. Further, the diffusion surface 116 may comprise an anti-reflective coating configured to reduce the amount of the light 118 that is reflected back into the transmission medium 112. Exemplary diffusion surfaces 116 may comprise an opal diffusion surface. The diffusion surface may be configured to provide a substantially Lambertian distribution of light although other diffusion profiles may be used.

In exemplary apparatus 100, the transmission medium 112 may have a refractive index greater than the refractive index of air. More specifically, the transmission medium 112 may have a refractive index substantially the same as the refractive index of the substrate 104. In exemplary apparatus, the transmission medium may have a refractive index in a range from −1 to +1 with respect to the refractive index of the substrate 104. The transmission medium 112 and the substrate 104 may be configured to minimise the reflection of the light 118 at the interface between the two. If the refractive indexes of the two materials are substantially equal, reflections of the light 118 are minimised and all of the light 118 emitted by the micro-LED is transmitted through the transmission medium.

By placing the light emitting surface 110 in contact with the first, upper, surface 114 of the transmission medium 112 having a refractive index greater than that of air, light that would be emitted into air at angles up to 90 degrees from a normal 120 are transmitted to the diffusion surface 116. That is, without the transmission medium 112 in contact with the light emitting surface 110, light emitted from the micro-LED 102 would be emitted at a range of angles from −90 degrees to +90 degrees with respect to the normal 120, but this light is transmitted to the diffusion surface 116 by the arrangement of FIG. 1. In effect, the light at angles all the way down to ±90 degrees to the normal is pulled into the transmission medium by virtue of its refractive index. The apparatus 100 therefore allows the profiling of the entire beam of light 118 emitted from the micro-LED by monitoring the light presented at the diffusion surface 116.

In prior art arrangements, light that would be emitted into air at angles up to ±90 degrees to the normal is not captured and so does not contribute to beam profiling. This may be because an integrating sphere cannot be placed closely enough to a light emitting surface of a device to capture all light emitted, or because, in reflective geometries or gemotries in which a camera is placed in a beam path transmitted through air, light emitted at angles close to 90 degrees never makes it to the diffuse reflective screen.

Figure 2:
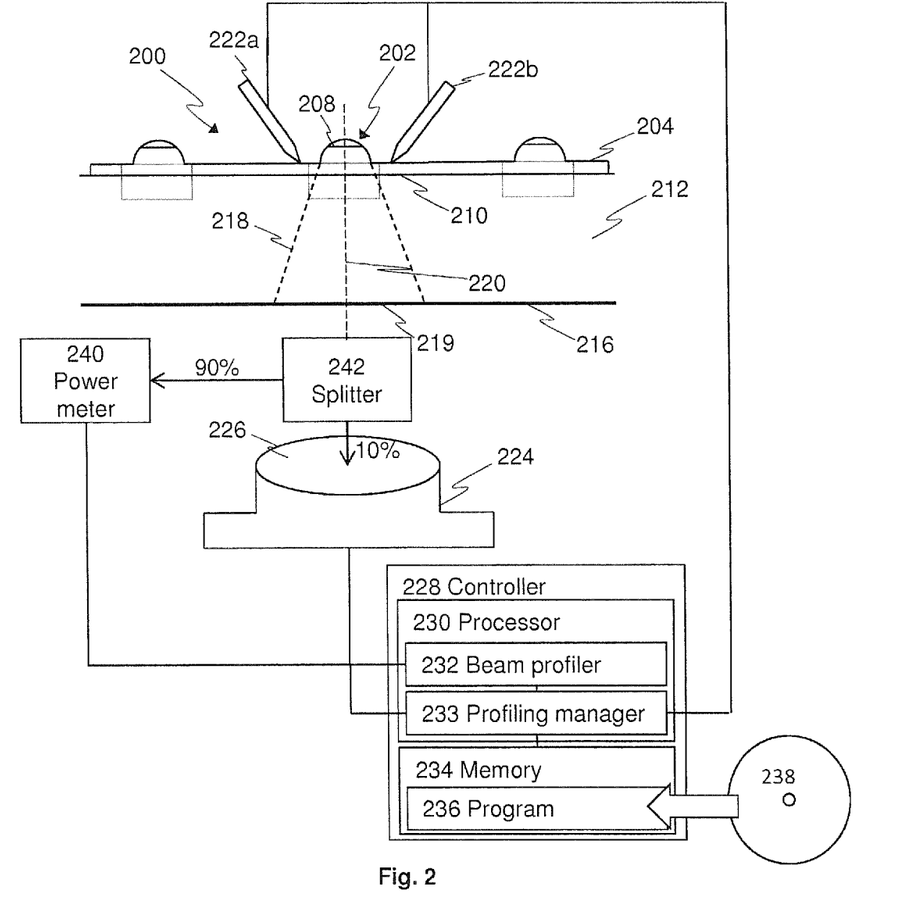
FIG. 2 is a schematic representation of an apparatus for profiling a beam of a light emitting semiconductor device.

FIG. 2 shows an apparatus 200 for beam profiling that includes some additional features to those shown in FIG. 1. Features of FIG. 2 that are similar to those discussed in respect of FIG. 1 are, for clarity, not discussed again here, except where necessary to discuss the function or configuration of the additional features of FIG. 2.

The apparatus 200 comprises a micro-LED 202 and a transmission medium 212, as described above. In addition, the apparatus 200 comprises a plurality of probes 222a, 222b. In the exemplary apparatus 200 there is a pair of probes 222a, 222b that are configured to apply an electrical current to the micro-LED 202, such that the active region 208 emits light 218. In other exemplary apparatus, there may be a different amount of probes.

The apparatus 200 further comprises a camera unit 224. The camera unit 224 is configured to capture an image of the diffusion surface 216. The camera unit 224 may be configured such that the field of view covers an area of the diffusion surface 216 showing light emitted from the micro-LED 202. As such, the camera unit 224 may be configured to capture an image of light at the diffusion surface 216 that has been emitted by the micro-LED 202. The field of view of the camera unit 224 may be configured based on the refractive index and the thickness of the transmission medium 212. The refractive index and thickness of the bulk transfer medium 212 contribute to determining the size of the light cone 218 and therefore to the size of the light displayed at the diffusion surface 216 and so define the requisite field of view and/or positioning of the camera unit 224, such that it is able to capture an image of the light.

The camera unit 224 may have a magnification factor of less than 1 or, more specifically, may have a magnification factor of 0.33. The magnification factor may be provided by a lens 226 over an aperture of the camera unit 224. The magnification factor is less than 1 because of the thickness of the transmission medium 212 and its refractive index. As discussed herein, the refractive index of the transmission medium 212 defines the cone of light 218 that would be emitted into ±90° in air. The thickness of the transmission medium 212 therefore defines the size of an image 219 of the beam 218 falling on the diffusion surface 216. The magnification of the lens 226 must then be sufficient to allow all of the image of the beam 219 to fall upon the camera detector.

Further, the camera unit 224 may be configured to have a depth of field that includes the diffusion surface 216, but which does not include the active region 208 of the micro-LED 202. Exemplary camera units 224 may have a depth of field in a range from 1 millimetre to 4 millimetres.

The apparatus 200 further comprises a controller 228. The controller 228 comprises a memory 234 and a processor 230. The memory 234 may comprise a non-volatile memory and/or a volatile memory. The memory 234 may have a computer program 236 stored therein. The computer program 236 may be configured to undertake the methods disclosed herein. The computer program 236 may be loaded in the memory 234 from a non-transitory computer readable medium 238, on which the computer program is stored. The processor 230 is configured to undertake at least the functions of a beam profiler 232 and a profiling manager 233.

Each of the memory 234, processor 230, beam profiler 232 and profiling manager 233 is in electrical communication with the other features 234, 230, 232, 233 of the controller 228. The controller 228 can be implemented as a combination of computer hardware and software. In particular, the beam profiler 232 and the profiling manager 233 may be implemented as software configured to run on the processor 230. The memory 234 stores the various programs/executable files that are implemented by a processor 230, and also provide a storage unit for any required data. The programs/executable files stored in the memory 234, and implemented by the processor 230, can include the beam profiler 232 and the profiling manager 233, but are not limited to such.

The profiling manager 233 may be configured to operate the probes 222a, 222b to apply an electrical current to the micro-LED 202. The profiling manager 233 may be further configured to operate the camera unit 224 to capture an image of the diffusion layer 216 during a time when the light 218 is displayed at the diffusion surface 216, which may also be a time when the probes are applying an electrical current to the micro-LED.

The beam profiler 232 is configured to receive an image captured by the camera unit 224 and, based on that image, determine an intensity of light that would be emitted from the emitting surface 210 into air, if the transmission medium 212 was not in contact with the light emitting surface 210. In order to profile the beam emitted from the micro-LED, the beam profiler 232 may determine a plurality of intensities and their respective angles of emission into air in a range from −90 degrees to +90 degrees from the normal 220. Further, the beam profiler 232 may be configured to determine an intensity and a two dimensional position providing a location of the pixel within the image 219 of the light cone 218 on the diffusion surface 216. This allows the beam to be fully profiled in three dimensions. The two dimensional position may be Cartesian or polar.

It is noted that in exemplary apparatus, the features of the controller 228 may be provided by a camera unit comprising a processor and a memory. In such exemplary apparatus, only the determined beam profile, which comprises a plurality of angles of emission into air and positions of pixels needs to be transmitted off the camera unit and stored.

The emitted light 218 passes from the emitting surface 210 immediately into the transmission medium 212. Since the transmission medium 212 has a higher refractive index than air the beam divergence will be less in the bulk transmission than in air, following Snell's Law.

$$n_1 \sin \theta_1 = n_2 \sin \theta_2$$

Wherein, $n_1$ and $\theta_1$ are the refractive index of the substrate 204 and the angle to the normal 220 in the substrate 204 respectively, and $n_2$ and $\theta_2$ are the refractive index of the transmission medium 212 and the angle to the normal 220 in the transmission medium 212 respectively.

The lens 226 collects light emitted from the diffusion surface 216 and forms an image of it on a detector of the camera unit 224. The image can be saved for later detailed analysis by the beam profiler 232. The beam profiler is configured to convert pixels of the image from the orthogonal geometry of the flat diffusion surface 232 to a radial geometry, thus the beam is measured as intensity against distance (micrometres) and converted to intensity against angle (degrees).

To characterise the beam of light 218 fully, the entire emission profile from −90 degrees to +90 degrees to the normal 220 must reach the diffusion surface 216. For transmission through air, this would require an infinitely wide diffusion surface 216 and a camera unit 224 with an infinitely wide field of view. In the methods and apparatus disclosed, the use of the transmission medium 212 to transmit the light 218 to the diffusion surface 216 means that all the light that would be emitted into air in the range from −90 degrees to +90 degrees to the normal 220 is contracted into a shallower light cone by the higher refractive index of the transmission medium 212. The angle of the light cone to the normal 220 corresponds to a critical angle of total internal reflection for air to transmission medium 212 interface, given by.

$$\theta_C = \sin^{-1}\frac{n_2}{n_1} = \sin^{-1}\frac{1}{1.5} = 41.8°$$

Wherein $\theta_C$ is the outer angle of the light cone in the transmission medium 212. The exemplary figures used in the above equation relate to an $n_1$ of glass, which may be used as the transmission medium 212 and an $n_2$ of air, which is equal to 1. Therefore, light inside the the glass travelling at an angle of 41.8 degrees or less to the normal would be emitted from a smooth glass/air interface into ±90 degrees in air. Since the transmission medium 212 system is 6 millimetres thick, this corresponds to an image size of approximately 11 mm.

Figure 3:
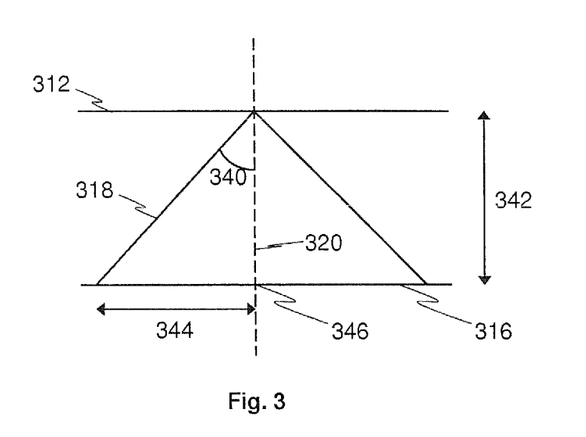
FIG. 3 is a schematic representation of a light cone transmitted through a transmission medium.

FIG. 3 shows a schematic representation of a light cone 318 transmitted through a transmission medium 312. As shown above, the angle 340 of the light cone to a normal 320 may be calculated. In the example provided above, for a glass transmission medium 312, the angle 340 is 41.8 degrees. Based on the angle 340 and the thickness 342 of the transmission medium 312, the distance 344 from the centre 346 of the light image on the diffusion surface 316 to the edge of the light image may be calculated, as set out below.

Since $$\tan\theta_1 = \frac{w}{h}$$

Wherein, $\theta_1$ is the angle 340, h is the thickness 342 and w is the distance 344.

Therefore w=h tan $\theta_1$=6 tan 41.8=5.366 mm

Therefore, the full diffusion surface 216 image width is 2w=10.72 mm. This is the full image size necessary to be captured by the camera unit 224.

In view of the above, the beam profiler 232 may be configured to determine an intensity of a pixel and a distance of the pixel from the centre 346 of the light image at the diffusion surface 316, and to convert from that orthogonal width 344 at the diffusion surface 316 to a radial angle $\theta_2$ that would be emitted into air by $$\theta_2 = \sin^{-1}\left[\frac{n_1}{n_2}\sin\left(\tan^{-1}\left(\frac{w}{h}\right)\right)\right]$$

The apparatus 200 may further comprise a power meter 240. The power meter 240 may be configured to determine the power output from the micro-LED. As shown in FIG. 2, the power meter 240 may be positioned offset from the camera 224 and, in particular apparatus and methods, may be at 90 degrees to the camera 224. A beam splitter 242 may be positioned between the camera 224 and the diffusion surface 216 and configured such that a percentage of the beam sufficient for an accurate power measurement is directed to the power meter 240. The remainder of the beam may be passed to the camera 224. In exemplary apparatus and methods, 90% of the beam may be directed to the power meter 240. Therefore, the power meter 240 is able to determine the power of the beam and the camera is able to determine the profile of the beam. This speeds up the measurement process, decreases setup time and makes system calibration simpler.

Figure 4:
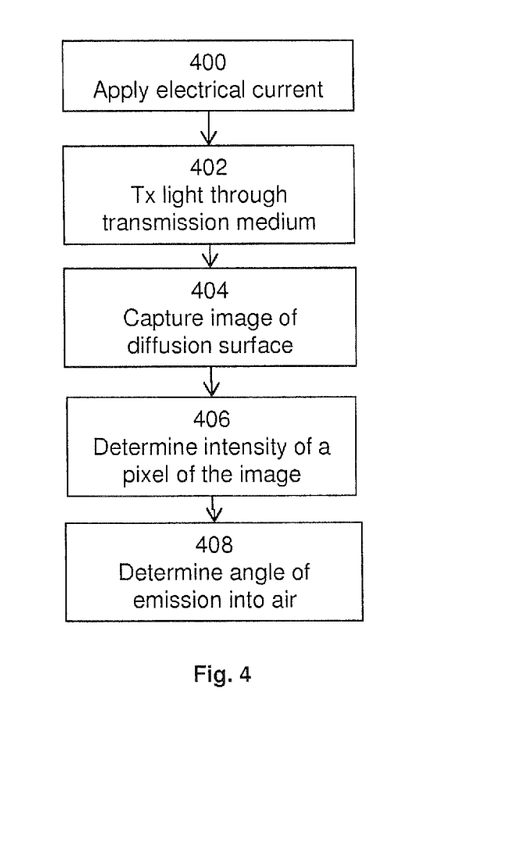
FIG. 4 is a flow diagram for a method for profiling a beam of a light emitting semiconductor device.

FIG. 4 shows a method of profiling a beam of a micro-LED. An electrical current is applied 400 to the micro-LED, such that light is generated by the active region 208. The electrical current may be applied by one or more probes 222a, 222b under the control of the profiling manager 233 of the controller 228. The light 218 is emitted from the emission surface 210 of the micro-LED 202 and transmitted 402 through the transmission medium 212 to the diffusion surface 216. An image is captured 404 of the light 218 that appears at the diffusion surface 216 by the camera unit 224. The image may be captured under the control of the profiling manager 233 and may be timed to coincide with a time when the probes 222a, 222b are applying the electrical current to the micro-LED 202. The beam profiler 232 determines 406 an intensity of a pixel of the image of the light at the diffusion surface 216. This may be done using standard techniques. The beam profiler then determines 408 an angle at which the light having the intensity of the pixel of the image would be emitted from the micro-LED into air, as described above.

Using the above method, the entire beam of the micro-LED may be profiled in the full range from −90 degrees to +90 degrees to the normal 220.

As shown in FIG. 2, the apparatus disclosed herein may comprise a wafer comprising a plurality of micro-LED devices. In such apparatus, the substrate 204 may be at least part of the wafer. Such arrangements allow the testing of a plurality of micro-LED devices at the wafer level. The wafer, including the micro-LED devices, may be moved to a plurality of positions wherein each of a plurality of micro-LEDs is in contact with the probes 222a, 222b. At that time, the profiling manager 233 may control the application of the electrical current and the capturing of the image. This may be repeated for each of the plurality of micro-LEDs.

It is noted that the apparatus shown in FIGS. 1 and 2 is exemplary and other arrangements are possible that do not comprise all the features shown in FIGS. 1 and 2. For example, exemplary apparatus may comprise a micro-LED and a transmission medium of a thickness of 5 millimetres or greater. Alternatively, exemplary apparatus may comprise a micro-LED and a transmission medium having a refractive index substantially the same as the refractive index of the substrate.

Exemplary apparatus and methods may use a Zeiss ERc5 camera, an Opto-Engineering×0.33 zero distortion lens and a Knight-Optics 6 mm glass and opal diffusion plate as the diffusion surface.

For calibration, it is possible to replace the diffuser plate with a CP002 ceramic template having mask features at a given pitch. It is then possible to adjust the lens to optimum focus conditions and accurately calibrate the image size. The vertical pitch of the mask features is, for example, 320 micrometres. Therefore, the image scale is precisely 6.7507 micrometres per pixel and the image is 17.28 millimetres× 12.69 millimetres.

Figure 5:
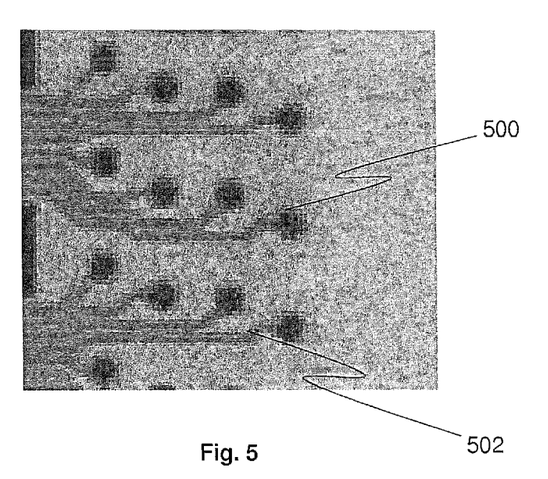
FIG. 5 is a close-up view of a mask showing pixelation at the limit of the camera resolution.

As shown in FIG. 5, a close-up view of the mask allows sight of pixelation at the limit of the camera resolution. The CP002 contact pads 500 are 40 micrometres across, which at optimum focus corresponds to 6 pixels. Track lines 502 are 10 micrometres and are at the resolution limit of the camera. From FIG. 5, it can be determined that the pads 500 are no more than 8 pixels across and the track lines are distinguishable, indicating the system is optimally focussed. Therefore, a method for focussing the camera unit comprises replacing the diffusion surface with a template having features of known dimensions, determining the dimensions of a pixel of an image captured by the camera unit and ensuring that the features of the correct number of pixels, based on the dimensions of the features and the dimensions of a pixel of the image.

An exemplary specification of components suitable for exemplary apparatus is given below.
  Exemplary apparatus parameters for beam profiling
  Image 1 cm×1 cm with no distortion
  System length approx 15 cm, from glass diffuser to beck of the camera and cable
  Quantify $\theta\frac{1}{2}$ of the beam
  Evaluate the proportion of power within the $\theta\frac{1}{2}$ limit
  Exemplary camera unit properties
  Monochromatic (although colour cameras may also be used)
  Defined response in 350 to 800 nm range
  Linear output with light intensity
  Compliance with recognised standards
  Camera Mount tbc
  Lens Mount C-mount
  Working Distance >1 cm, =<10 cm
  Connections Camera Link/Gbit (although a USB connection may also be used)
  Full length clearance (wafer to cable) 15 cm
  IEEE compatible
  External trigger for keithley 2430 ac operation A computer program may be configured to provide any of the above described methods. The computer program may be provided on a computer readable medium. The computer program may be a computer program product. The product may comprise a non-transitory computer usable storage medium. The computer program product may have computer-readable program code embodied in the medium configured to perform the method. The computer program product may be configured to cause at least one processor to perform some or all of the method.

Various methods and apparatus are described herein with reference to block diagrams or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, the invention may be embodied in hardware and/or in software (including firmware, resident software, micro-code, etc.) that runs on a processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

The skilled person will be able to envisage other embodiments without departing from the scope of the appended claims.

The invention claimed is:

1. An apparatus for profiling a beam of a light emitting semiconductor device, comprising:
  the light emitting semiconductor device comprising an active region formed on a substrate and configured to generate light when a suitable electrical current is applied to contacts on an upper surface of the device, and a light emitting surface defined by a lower surface of the substrate opposite the contacts; and
  a transmission medium comprising a first surface in direct contact with at least part of the light emitting surface of the semiconductor device and a diffusion surface, opposite the first surface, the diffusion surface being one of (i) a roughened side of the transmission medium opposite the first surface or (ii) a coating on the transmission medium opposite the first surface, the diffusion surface diffusing the light emitted from the semiconductor device and transmitted through the transmission medium.

2. The apparatus according to claim 1, wherein the transmission medium has a thickness of 3 mm or greater.

3. The apparatus according to claim 1, wherein the transmission medium has a refractive index substantially equal to a refractive index of the substrate of the light emitting semiconductor device, such that there is substantially no reflection at the interface between the transmission medium and the substrate of the light emitting semiconductor device.

4. The apparatus according to claim 1, further comprising a pair of probes configured to apply an electrical current to the contacts of the light emitting semiconductor device for causing the active region to generate the light.

5. The apparatus according to claim 1, further comprising a camera configured to capture an image of light at the diffusion surface that has been emitted from the light emitting semiconductor device.

6. The apparatus according to claim 5, wherein the camera comprises a lens with a magnification factor of less than 1.

7. The apparatus according to claim 6, wherein the transmission medium has a refractive index and a thickness configured to present at the diffusion surface the light emitted from the light emitting semiconductor device, wherein the image falls within a field of view of the camera.

8. The apparatus according to claim 6, wherein the thickness of the transmission medium is greater than a depth of field of the lens of the camera.

9. The apparatus according to claim 5, further comprising a controller, the controller comprising a beam profiler configured to process an image captured by the camera, of light at the diffusion surface to determine an angle to a normal of light that would be emitted into air from the light emitting surface of the light emitting semiconductor device.

10. The apparatus according to claim 9, further comprising a power meter configured to determine a power of the light at the diffusion surface and to transmit data indicative of the determined power to the beam profiler.

11. The apparatus according to claim 10, wherein the power meter is offset from the camera, the apparatus further comprising a beam splitter configured to direct a portion of the beam emitted from the semiconductor device to the power meter.

12. The apparatus according to claim 9, wherein the beam profiler is configured to determine a power of the light at the diffusion surface based on an intensity of a pixel of the image.

13. The apparatus according to claim 12, wherein the beam profiler is configured to determine an angle into air at which the light forming the pixel would be transmitted by the light emitting semiconductor device using:

wherein, n1 is a refractive index of the substrate, n2 is a refractive index of the transmission medium, w is a distance of the pixel from a center of the light at the diffusion surface and h is the thickness of the transmission medium.

14. The apparatus according to claim 9, further comprising a pair of probes configured to apply an electrical current to the contacts of the light emitting semiconductor device for causing the active region to generate light and wherein the controller comprises a profiling manager configured to coordinate the operation of the pair of probes and the camera, such that the camera captures an image during a time when the probes are applying an electrical current to the light emitting semiconductor device.

15. The apparatus according to claim 1, further comprising a plurality of light emitting semiconductor devices grown on a silicon wafer, wherein the first surface of the transmission medium is in contact with the light emitting surfaces of more than one of the plurality of light emitting semiconductor devices.

16. A method for profiling a beam of a light emitting semiconductor device, the method comprising:
applying an electrical current to contacts on an upper surface of the light emitting semiconductor device, the light emitting semiconductor device comprising an active region formed on a substrate and a light emitting surface defined by a lower surface of the substrate opposite the contacts;
transmitting light emitted from the light emitting semiconductor device through a transmission medium comprising a first surface in direct contact with at least part of the light emitting surface of the light emitting semiconductor device and a diffusion surface, the diffusion surface being one of (i) a roughened side of the transmission medium opposite the first surface or (ii) a coating on the transmission medium opposite the first surface, the diffusion surface diffusing the light emitted from the light emitting semiconductor device and transmitted through the transmission medium; and
determining intensity power of light that would be emitted into air from the light emitting semiconductor device at one or more angles with respect to a normal.

17. A method for profiling a beam of a light emitting semiconductor device, the method comprising:
processing, by a beam profiler, an image to determine intensity power of light that would be emitted into air from the light emitting semiconductor device at one or more angles with respect to a normal,
the image comprising light emitted from a light emitting semiconductor device comprising an active region formed on a substrate and configured to generate light when a suitable electrical current is applied to contacts on an upper surface of the device, and a light emitting surface defined by a surface of the substrate opposite the contacts,
the light further being transmitted through a transmission medium comprising a first surface in direct contact with at least part of the light emitting surface of the light emitting semiconductor device and a diffusion surface, the diffusion surface being one of (i) a roughened side of the transmission medium opposite the first surface or (ii) a coating on the transmission medium opposite the first surface, the diffusion surface diffusing the light emitted from the light emitting semiconductor device and transmitted through the transmission medium.

18. The method according to claim 17, wherein the beam profiler is configured to determine an angle into air at which light forming a pixel of the image would be transmitted by the light emitting semiconductor device using:
wherein, n1 is a refractive index of the substrate, n2 is a refractive index of the transmission medium, w is a distance of the pixel from a center of the light at the diffusion surface and h is the thickness of the transmission medium.

19. A non-transitory computer readable medium comprising computer readable code configured, when read by a computer, to carry out the method according to claim 17.

20. A computer program comprising computer readable code configured, when read by a computer, to carry out the method according to claim 17.

* * * * *

UNITED STATES PATENT AND TRADEMARK OFFICE
CERTIFICATE OF CORRECTION

PATENT NO. : 11,099,063 B2
APPLICATION NO. : 15/103344
DATED : August 24, 2021
INVENTOR(S) : Christopher Percival et al.

Page 1 of 1

It is certified that error appears in the above-identified patent and that said Letters Patent is hereby corrected as shown below:

In the Claims

Column 13, Line 57, Claim 13, delete "wherein," and insert -- $\sin^{-1}\left[\frac{n_1}{n_2}\sin\left(\tan^{-1}\left(\frac{w}{h}\right)\right)\right]$ wherein, --.

Column 14, Line 60, Claim 18, delete "wherein," and insert -- $\sin^{-1}\left[\frac{n_1}{n_2}\sin\left(\tan^{-1}\left(\frac{w}{h}\right)\right)\right]$ wherein, --.

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*